(12) United States Patent
Jacquinot et al.

(10) Patent No.: US 7,144,814 B2
(45) Date of Patent: Dec. 5, 2006

(54) ABRASIVE COMPOSITION FOR THE INTEGRATED CIRCUITS ELECTRONICS INDUSTRY

(75) Inventors: Eric Jacquinot, Trosly Breuil (FR); Pascal Letourneau, Cessy (FR); Maurice Rivoire, Meylan (FR)

(73) Assignee: AZ Electronic Materials USA Corp., Somerville, NJ (US)

( * ) Notice: Subject to any disclaimer, the term of this patent is extended or adjusted under 35 U.S.C. 154(b) by 651 days.

(21) Appl. No.: 09/427,675

(22) Filed: Oct. 27, 1999

(65) Prior Publication Data

US 2002/0142600 A1  Oct. 3, 2002

(30) Foreign Application Priority Data

Nov. 9, 1998  (FR) .................................. 98 14073

(51) Int. Cl.
*H01L 21/461* (2006.01)
*H01L 21/302* (2006.01)

(52) U.S. Cl. ........................ 438/690; 438/692; 438/693

(58) Field of Classification Search ........ 438/690–693; 451/41, 106, 111, 291, 285, 290; 51/295, 51/298, 307, 308, 309; 156/365
See application file for complete search history.

(56) References Cited

U.S. PATENT DOCUMENTS

| | | | |
|---|---|---|---|
| 4,626,607 A | | 12/1986 | Jacquinot et al. |
| 5,624,303 A | * | 4/1997 | Robinson .................... 451/285 |
| 5,733,176 A | * | 3/1998 | Robinson et al. ............. 451/41 |
| 5,738,800 A | * | 4/1998 | Hosali et al. ................ 216/99 |
| 5,759,917 A | * | 6/1998 | Grover et al. ............. 438/690 |
| 5,769,691 A | * | 6/1998 | Fruitman ..................... 451/41 |
| 5,958,794 A | * | 9/1999 | Bruxvoort et al. .......... 438/692 |
| 6,043,159 A | * | 3/2000 | Jacquinot et al. ........... 438/693 |
| 6,126,518 A | | 10/2000 | Jacquinot et al. |
| 6,136,912 A | | 10/2000 | Jacquinot et al. |

FOREIGN PATENT DOCUMENTS

| | | | |
|---|---|---|---|
| EP | 0-192-047 | * | 8/1986 |
| EP | 0 708 160 | | 4/1996 |
| EP | 0 853 110 | | 7/1998 |
| FR | 2 754 937 | | 4/1998 |
| FR | 2 761 629 | | 10/1998 |

OTHER PUBLICATIONS

Database WPI, Section Ch, Week 9248, Derwent Publications Ltd., London, GB; AN 92-393517 XP002109969 & JP 04 291723 A, Oct. 15, 1992.

* cited by examiner

*Primary Examiner*—Duy-Vu N Deo
(74) *Attorney, Agent, or Firm*—Browdy and Neimark, PLLC

(57) ABSTRACT

Abrasive composition for the integrated circuits electronics industry comprising an aqueous acid suspension of individualized colloidal silica particles not linked to each other by siloxane bonds and an abrasive surfactant, this abrasive being for mechanical chemical polishing in the integrated circuits industry, comprising a fabric impregnated by such a composition, and a process for mechanical chemical polishing.

24 Claims, No Drawings

ABRASIVE COMPOSITION FOR THE INTEGRATED CIRCUITS ELECTRONICS INDUSTRY

The present invention relates to new abrasive compositions which can be used in particular during mechanical chemical polishing of silicon oxide layers, silicon nitride layers and layers based on polymers with a low dielectric constant used in the semi-conductors microelectronics industry and, more particularly, during the production of integrated circuits.

Basic colloidal-silica based abrasive compositions and surfactants are used for polishing primary silicon. This primary operation is followed by a certain number of other operations with the aim of producing integrated circuits.

During the production of integrated circuits, it can be useful to have abrasive mechanical chemical polishing compositions which have a high selectivity for the polishing speed between silicon oxide and silicon nitride, the selectivity being the ratio between the abrasion speeds of each substrate. Silicon oxide can either be obtained by oxygen diffusion at a high temperature on silicon wafer (thermal oxide or SiO2) or deposited on the silicon wafer (for example tetraethoxysilane oxide or TEOS).

When producing integrated circuits, one of the first stages consists of defining the active zones of different transistors which constitute the circuits. These active zones should be isolated from each other by means of a silicon oxide zone, an electrically isolating material. These silicon oxide patterns were up to now most often defined by the local silicon oxidation technique (LOCOS).

The reduction of the dimensions of devices now precludes this technique, the main disadvantage of which is the production of an undesired area bordering the oxidation zone, called a bird's mouth. LOCOS oxidation today therefore is mostly replaced by the STI technique (shallow trench isolation) which consists of generating steep trenches in the silicon by reactive ionic engraving, then filling them with a TEOS type oxide deposit.

This silicon oxide layer should then be levelled by a mechanical chemical polishing stage. An enhanced degree of levelling for this stage is essential.

One way of improving the levelling quality is to deposit a layer of silicon nitride on the ridges between the trenches (in practice, the silicon nitride is usually deposited over the whole surface of the silicon wafer, then the whole is recess-engraved to form the trenches, and because of this, the silicon nitride is left on the ridges between the trenches), then to deposit a layer of silicon oxide to fill up the trenches. This excess oxide overflows the trenches and covers the silicon nitride.

The silicon oxide layer is then levelled using abrasive compositions until the silicon nitride layer is reached, which thus plays the role of a layer resistant to the abrasion on condition that the selectivity of the polishing speeds between silicon oxide and silicon nitride is high.

In the literature, G. G. Lisle et al, U.S. Pat. No. 5,759,917, described an aqueous mechanical chemical polishing suspension comprising 0.1 to 4% by weight of ceric ammonium nitrate and 0.1 to 3% by weight of acetic acid. This polishing suspension with a pH comprised between 3.8 and 5.5 has a silicon PETEOS/nitrate polishing selectivity less than or equal to 35, i.e. the silicon oxide is abrased 35 times faster than the silicon nitride. One part of the ceric ammonium nitrate can be replaced by the pyrogenic silica.

Moreover, S. D. Hosali et al, U.S. Pat. No. 5,738,800, mentioned the polishing of a composite comprising silica and silicon nitride by a polishing composition comprising 0.2 to 5% by weight of cerium oxide, 0.5 to 3.5% potassium hydrogen phtalate as chelating agent, and 0.1 to 0.5% of fluorinated surfactant. The composition was brought to a neutral pH by the addition of a base. Silica can be added to the polishing compositions. With the best compositions described, a polishing selectivity of approximately 300 can be achieved.

Similarly, during the production of integrated circuits, the electronic devices formed on a silicon wafer should be connected to each other by means of metal interconnection lines to compose the desired electronic circuit. Each metal interconnection level should be isolated electrically. To this end, each level is encapsulated in a dielectric layer.

The metallic interconnection lines of integrated circuits are mostly formed by the reactive ionic engraving of metal according to the following sequence: an aluminium or aluminium alloy film approximately 10–12 m thick is deposited by a beam of electrons or ions (sputtering), the design of the interconnection circuit is then transferred onto it by photolithography then by Reactive Ionic Etching (RIE). The lines thus defined are then recovered by a dielectric layer, usually silicon oxide based, mostly obtained by decomposition in vaporous phase of tetraethylorthosilicate (TEOS). This layer is then levelled by mechanical chemical polishing.

In order to reduce the capacities induced by this dielectric, one method consists of using materials with low dielectric constants. The best candidates were listed by N. H. Hendricks—Mat. Res. Soc. Symp. Proc., vol. 443, 1997 p. 3–14, and by L. Peters—Semi Conductor International—September 1998, p. 64–74.

The main families retained are:
fluorinated poly(aryl ethers) such as Flare®,
poly(aryl ethers) such as PAE-2,
fluorinated polyamides,
hydridosilsesquioxanes and alkylsilsesquioxanes,
bisbenzocyclobutenes such as Cyclotene®,
poly(p-xylylene) such as Parylene®N and poly($\alpha,\alpha,\alpha',\alpha'$-tetrafluoro-p-xylylene) such as Parylene®F,
aromatic ether polymers of perfluorocyclobutane,
aromatic hydrocarbons such as SiLK®.

To be able to be integrated in a microelectronic interconnection process, these polymers with a low dielectric constant must satisfy in principle the following criteria:
filling trenches of width less than 0.35 pm
a vitreous transition temperature higher than 400° C.,
a low humidity absorption (<1%),
an enhanced thermal stability (<1%/h at 450° C.),
an enhanced adhesion to the metal layers and other dielectric layers.

Moreover, the polymer layer deposited must be able to be subsequently levelled by mechanical chemical polishing.

Y. L. Wang et al in *Thin Solid Films*, (1997), 308–309, p. 550–554, polished an alkyl siloxane layer by means of an abrasive solution comprising fumed silica particles in base medium (pH=10.2) or zirconium oxide particles in acid medium (pH=3.3–4.6).

G. R. Yang et al in J. of Electronic Materials, Vol. 26, no. 8, 1997, p. 935–940, studied the surface quality of a layer of Parylene®N obtained after polishing with different abrasive solutions comprising aluminium particles in acid or alkaline medium. The polishing speeds obtained are low whatever the abrasive solution used.

J. M. Neirynck et al in Mater. Res. Soc. Symp. Proc., 1995, vol. 381, p. 229–235) attempted to polish three types of polymers with a low dielectric constant, Parylene®, benzocyclobutene (BCB) and a fluorinated polyimide, by means of abrasive solutions comprising aluminium particles in a base or acid medium.

Currently, the integration of polymer layers with a low dielectric constant in a microelectronic interconnection process is running into difficulties principally with insufficient performances obtained on this type of material during the levelling stage by mechanical chemical polishing. This stage is not yet fully mastered, in particular in relation to the polishing speed and the surface state of the polished surface.

It was determined in surprising and unexpected manner that the use of an aqueous acid suspension of cationised colloidal silica containing colloidal silica particles not linked to each other by siloxane bonds, allows a layer of a polymer-based isolating material with a low dielectric constant, in particular of SiLK® type, to be polished resulting in a very good compromise on the polishing speed, polishing uniformity and surface state properties of the polished surface.

A subject of the present Application is therefore a mechanical chemical polishing composition for a layer made of polymer-based isolating material with a low dielectric constant, characterized in that said polishing composition comprises an aqueous acid suspension of cationised colloidal silica containing individualised colloidal silica particles not linked to each other by siloxane bonds and water as suspension medium.

By "aqueous acid suspension of cationised colloidal silica" is meant an aqueous acid suspension of colloidal silica surface-modified by tri- or tetravalent metal oxides such as aluminium, chromium, gallium, titanium or zirconium and which are in particular described in the book "The Chemisty of Silica—R. K. Iler-Wiley Interscience (1979) p. 410–411".

Under preferential conditions of using the invention, the aqueous acid solution of cationised colloidal silica containing colloidal silica particles not linked to each other by siloxane bonds is obtained using a solution of aluminium hydroxychloride at approximately 50% by weight in which an alkaline silica sol stabilised with sodium is introduced under agitation at a pH of approximately 9. A stable suspension of cationic colloidal silica particles of pH comprised between 3.5 and 4 is thus obtained.

In the present Application, by "polymer-based isolating material with a low dielectric constant of SiLK® type" is meant a material as described by P. H. Towsend et al in Mat. Res. Soc. Symp. Proc. 1997, 476, p. 9–17. This material is constituted by an oligomeric solution of viscosity of 30 mPa.s, the polymerisation of which does not require a catalyst and does not induce the formation of water. The polymerised network is an aromatic hydrocarbon which does not contain fluorine. Its dielectric constant is 2.65, its vitreous transition temperature is higher than 490° C. and its refraction index is 1.63.

It would therefore be desirable to have a composition providing a high abrasion selectivity.

Thus, the Applicant determined in surprising and unexpected manner that the addition of a low quantity of surfactant to an aqueous acid suspension of individualised colloidal silica particles not linked to each other by siloxane bonds allowed the polishing speed of the silicon nitride ($Si_3N_4$) to be reduced very considerably whilst preserving the polishing speed of the silicon oxide (thermal oxide or tetraethoxysilane oxide). This translates as a considerable increase in the silicon oxide/silicon nitride polishing selectivity which can reach values of up to 500.

The Applicant also determined in surprising and unexpected manner that the addition of a low quantity of surfactant to an aqueous acid suspension of individualised colloidal silica particles not linked to each other by siloxane bonds allowed the polishing speed of polymers with a low dielectric constant to be increased very considerably.

A subject of the present invention is thus an abrasive composition for the integrated circuits industry, characterized in that it comprises or is preferably constituted by an aqueous acid suspension of individualised colloidal silica particles not linked to each other by siloxane bonds and a surfactant.

The colloidal silica particles of aqueous acid suspensions of the present invention advantageously have an average diameter comprised between 12 and 100 nm, preferably between 35 and 50 nm.

Such aqueous suspensions of colloidal silica can be obtained either from alkaline silicates, in particular sodium or potassium, or from ethyl silicate. In these two cases, using means known to the person skilled in the art and described in more detail in KK. Iler in "The Chemistry of silica", chapter 9, pages 331 to 343, published by Wiley Interscience, 1979, aqueous acid suspensions of colloidal silica containing individualised particles not linked to each other by siloxane-type bonds of diameter comprised between 12 and 100 nm can be obtained.

The pH of such aqueous acid suspensions of colloidal silica is preferably comprised between 1 and 5 and most particularly between 2 and 3.

A particular subject of the present Application is an abrasive composition, as above, in which the concentration of the polishing substance, i.e., the colloidal silica, is comprised between 5 and 50%, notably between 20 and 40%, particularly between 25 and 35% and most particularly approximately 30% by weight.

The surfactant used allows the polishing speed of the silicon nitride to be reduced very considerably whilst preserving the polishing speed of the silicon oxide. A selective polishing of the silicon oxide relative to the silicon nitride is thus obtained. It also allows the polishing speed of polymers with a low dielectric constant to be increased very considerably.

The quantity of surfactant(s) used in the polishing composition advantageously corresponds to a volumic concentration comprised between 0.001% and 5%, notably comprised between 0.005 and 2% and very preferably to a volumic concentration of 0.01 to 1%. The surfactants used can be commercially available products such as for example those cited below in the examples.

Preferably, the polishing composition according to the invention contains less than 5% of an oxidising agent and more particularly no oxidising agent at all.

It was determined that if polishing compositions having a good long-term preservation time were to be formed, anionic or non-ionic type surfactants would preferably have to be used, as opposed to cationic surfactants which tend to destabilise colloidal silica based aqueous acid polishing solutions and thus to diminish the preservation time of the abrasive compositions. Very preferably, anionic surfactants for which the Applicant obtained unexpected and very convincing results will be used.

The compositions according to the invention have remarkable qualities and in particular:

an $SiO_2/Si_3N_4$ polishing selectivity being able to be adjusted over an extensive range of values (5 to 500) according to the concentration of surfactants, increasing the concentration usually increases the selectivity, an excellent surface state of polished silicon oxide layer,
an improved silicon oxide polishing uniformity,
a very good levelling effect,
a very good polishing speed for polymers with a low dielectric constant.

They justify the use of compositions according to the invention, in particular for the formation of abrasives for the integrated circuits industry.

For this reason, a subject of the present invention is also an abrasive for mechanical chemical polishing in the integrated circuits industry, characterized in that it comprises a fabric impregnated with an aqueous acid suspension of colloidal silica of pH comprised between 1 and 5 containing individualised particles not linked to each other by siloxane bonds of diameter comprised between 12 and 100 nm, and a surfactant preferably of anionic or non-ionic type.

Finally, a subject of the invention is a process for mechanical chemical polishing in the integrated circuits industry in which a silicon oxide layer, a silicon nitride layer and a layer of polymers with a low dielectric constant is rubbed with a support impregnated with an abrasive composition, characterized in that the abrasive composition comprises an aqueous acid suspension of individualised colloidal silica particles not linked to each other by siloxane bonds and a surfactant.

The preferred conditions indicated above for the abrasive compositions of the invention apply to other subjects of the invention.

The scope of this will be understood better with reference to the examples given below, the aim of which is to explain the advantages of the invention.

EXAMPLE 1

Example of mechanical chemical polishing of wafers with aqueous-suspension based abrasives with an colloidal silica acid pH and an anionic surfactant of secondary n-alkane sulphonate type.

There is a thermal growth of silicon oxide (called hereafter SiO2) 6000 Å thick or a deposit of silicon nitride (called hereafter Si3N4) 1600 Å thick on each silicon wafer.

The wafers thus formed are then polished on a PRESI 2000 polisher with the following polishing conditions:

| bearing force: | 0.5 daN/cm² |
| turntable speed | 30 r.p.m. |
| head speed: | 42 r.p.m. |
| abrasive temperature: | 10° C. |
| abrasive flow rate | 100 cm³/min |
| fabric: | IC 1400 (Rodel) |

With an aqueous acid suspension of colloidal silica, the characteristics of which are the following:

| pH of the aqueous suspension: | 2.5 |
| average diameter of elementary colloidal silica particles: | 50 nm |
| concentration by weight of colloidal silica: | 30% | and with a secondary alkane sulphonate-type surfactant having a chain length of 13 to 18 carbon atoms and average molecular weight of approximately 328, sold by Clariant under the name ®Emulsogen EP.

The following results were obtained:

TABLE NO. 1

| Test | EP Emulsogen % (vol) | $SiO_2$ Polishing speed (Å/min) | $Si_3N_4$ Polishing speed (Å/min) | $SiO_2/Si_3N_4$ Polishing selectivity |
|---|---|---|---|---|
| 1 | 0.25 | 1151 | 9 | 128 |
| 2 | 0.50 | 1232 | 7 | 176 |
| 3 | 1.00 | 1273 | 9 | 141 |
| 4 | 0 | 1145 | 527 | 2 |

Relative to the specimen without surfactant (sample 4), the following was determined:

a slightly increased polishing speed of the silicon oxide layer according to the quantity of anionic surfactant used, a very large decrease in the polishing speed of the silicon nitride layer according to the quantity of anionic surfactant used, even with small quantities of surfactant, as a result, a very greatly improved $SiO_2/Si_3N_4$ polishing selectivity increasing from 2 (without an anionic surfactant) to values comprised between 128 and 176 in the presence of 0.25 to 1% anionic surfactant, an excellent surface state of the polished silicon oxide layer, an improved silicon oxide polishing uniformity.

EXAMPLE 2

With aqueous acid suspensions of colloidal silica and anionic surfactant similar to those in example 1, the polishing speed of a tetraethoxysilane (TEOS) layer deposited on a silicon wafer was studied relative to the polishing speed of a silicon nitride ($Si_3N_4$) layer deposited on a silicon wafer of the same type.

Under the same operating conditions as in example 1, but with an aqueous acid suspension of colloidal silica, the characteristics of which are the following:

| pH of the aqueous suspension: | 2.5 |
| average diameter of elementary colloidal silica particles: | 35 nm |
| concentration by weight in colloidal silica: | 30% | and with an anionic surfactant of secondary n-alkane sulphonate type, similar to that of example 1, the following results are obtained:

TABLE NO. 2

| Test | EP Emulsogen % (vol) | TEOS Polishing speed (Å/min) | $Si_3N_4$ Polishing speed (Å/min) | $TEOS/Si_3N_4$ Polishing selectivity |
|---|---|---|---|---|
| 5 | 0.05 | 2007 | 98 | 20 |
| 6 | 0.10 | 1989 | 24 | 83 |
| 7 | 0.50 | 2193 | 7 | 313 |
| 8 | 1.00 | 2075 | 4 | 520 |
| 9 | 0 | 1905 | 438 | 4.4 |

Relative to a specimen without surfactant (sample 9), the following was determined:

a slight increase in the polishing speed of the TEOS deposit when anionic surfactant is added to an aqueous acid colloidal silica polishing solution, a very large decrease in the polishing speed of silicon nitride the more the quantity of anionic surfactant used is increased, as a result, a very greatly improved TEOS/$Si_3N_4$ polishing selectivity increasing from 4.4 (without anionic surfactant) to 520 (in the presence of 1% anionic surfactant of secondary n-alkane sulphonate type)

an excellent surface state of the polished TEOS oxide layer an improved TEOS oxide polishing uniformity.

EXAMPLE 3

Under the same operating conditions as in example 1, but with an aqueous acid solution of colloidal silica, the characteristics of which are the following:

| | |
|---|---|
| pH of the aqueous suspension: | 2.5 |
| average diameter of the elementary colloidal silica particles: | 35 nm |
| concentration by weight of colloidal silica: | 30% | and with a surfactant which is sodium dodecyl sulphate, the following results are obtained:

TABLE NO. 3

| Test | EP Emulsogen % (vol) | $SiO_2$ Polishing speed (Å/min) | $Si_3N_4$ Polishing speed (Å/min) | $SiO_2/Si_3N_4$ Polishing selectivity |
|---|---|---|---|---|
| 10 | 0.5 | 1224 | 18 | 68 |
| 11 | 0 | 1308 | 438 | 3 |

Relative to the specimen without surfactant (sample 11), the following is determined:
  a slightly decreased polishing speed of the silicon oxide layer with 0.5% sodium dodecyl sulphate,
  a very large reduction of the polishing speed of the silicon nitride layer with 0.5% sodium dodecyl sulphate,
  as a result, a greatly improved polishing selectivity increasing from 3 (without sodium dodecyl sulphate) to 68 with 0.5% of sodium dodecyl sulphate.

EXAMPLE 4

In the same operating conditions as in example 3, but polishing a TEOS oxide layer instead of the thermal $SiO_2$ layer of example 3, the following results are obtained:

TABLE NO. 4

| Test | EP Emulsogen % (vol) | TEOS Polishing speed (Å/min) | $Si_3N_4$ Polishing speed (Å/min) | TEOS/$Si_3N_4$ Polishing selectivity |
|---|---|---|---|---|
| 12 | 0.5 | 1687 (17%) | 18 | 94 |
| 13 | 0 | 1905 (11%) | 438 | 4.4 |

Relative to the specimen without surfactant (sample 13), the following is determined:
  a slight reduction in the polishing speed of the TEOS deposit when 0.5% sodium dodecyl sulphate is added,
  a very large decrease in the polishing speed of silicon nitride,
  as a result, a very greatly improved TEOS/$Si_3N_4$ polishing selectivity increasing from 4.4 (without surfactant) to 94 (in the presence of 0.5% sodium dodecyl sulphate).

COMPARISON EXAMPLE 1

Under the same operating conditions as example 1, but using an aqueous suspension of colloidal silica, the characteristics of which are the following:

| | |
|---|---|
| pH of the aqueous suspension: | 7 |
| average diameter of the elementary colloidal silica particles | 50 nm |
| concentration by weight in colloidal silica: | 30% | an a secondary n-alkane sulphonate-based surfactant similar to that of example 1, the following results were obtained:

TABLE NO. 5

| Test | EP Emulsogen % (vol) | $SiO_2$ Polishing speed (Å/min) | $Si_3N_4$ Polishing speed (Å/min) | $SiO_2/Si_3N_4$ Polishing selectivity |
|---|---|---|---|---|
| 14 | 1.00 | 1690 (17%) | 534 | 3.2 |
| 15 | 0 | 1662 (11%) | 504 | 3.3 |

It was determined in this example that the use of a colloidal silica suspension with neutral pH in association with 1% EP Emulsogen does not modify the polishing speeds of the $SiO_2$ layer and the $Si_3N_4$ layer relative to the compositions without anionic surfactant, resulting in a non-improvement of the $SiO_2/Si_3N_4$ polishing selectivity which remains at the level of 3.2–3.3 which is poor within the scope of the present invention.

COMPARISON EXAMPLE 2

Under the same conditions as in example no. 1, but with a colloidal silica suspension, the characteristics of which are the following:

| | |
|---|---|
| pH of the aqueous suspension: | 11 |
| average diameter of the elementary colloidal silica particles: | 50 nm |
| concentration by weight in colloidal silica: | 30% | and secondary n-alkane sulphonate type surfactant similar to that of example 1, the following results are obtained:

TABLE NO. 6

| Test | EP Emulsogen % (vol) | $SiO_2$ Polishing speed (Å/min) | $Si_3N_4$ Polishing speed (Å/min) | $SiO_2/Si_3N_4$ Polishing selectivity |
|---|---|---|---|---|
| 16 | 0.50 | 1588 | 492 | 3.2 |
| 17 | 1.00 | 1556 | 501 | 3.1 |
| 18 | 0 | 1555 | 495 | 3.1 |

In this example, it is determined that the use of a colloidal silica suspension with basic pH in association with 0.5 to 1% EP Emulsogen does not modify the polishing speeds of the $SiO_2$ oxide layer and the $Si_3N_4$ layer, hence there is no improvement in the $SiO_2/Si_3N_4$ polishing selectivity which remains at the level of 3.1–3.2, which is poor within the scope of the present invention.

EXAMPLE 5

There is a deposit of a SiLK® type polymer with a low dielectric constant 1000 Å thick on each silicon wafer, then the layer is polymerised by tempering at 450° C.

Under the same operating conditions as in example 1, but with an aqueous acid suspension of colloidal silica, the characteristics of which are the following:

| | |
|---|---|
| pH of the aqueous suspension: | 2.5 |
| average diameter of elementary colloidal silica particles: | 50 nm |
| concentration by weight in colloidal silica: | 30% | and with an anionic surfactant of secondary n-alkane sulphonate type, similar to that of example 1, the following results are obtained:

TABLE NO. 7

| Tests | EP Emulsogen % (vol) | SiLK Polishing speed (Å/min) | Polishing uniformity (%) |
|---|---|---|---|
| 19 | 0.5 | 1695 | 14.5 |
| 20 | 0 | 14 | Not significant |

Relative to the specimen without surfactant (sample 20), the following is determined:
- a very large increase in the polishing speed of the SiLK deposit when anionic surfactant is added to an aqueous acid colloidal silica polishing solution,
- a good SiLK deposit polishing uniformity when anionic surfactant is added to an aqueous acid colloidal silica solution.

COMPARISON EXAMPLE 3

Under the same conditions as in example 5, but with a colloidal silica suspension, the characteristics of which are the following:

| | |
|---|---|
| pH of the aqueous suspension: | 12 |
| average diameter of the elementary colloidal silica particles: | 50 nm |
| concentration by weight in colloidal silica: | 30% | and secondary n-alkane sulphonate type surfactant similar to that of example 5, the following results are obtained:

TABLE NO. 8

| Tests | EP Emulsogen % (vol) | SiLK Polishing speed (Å/min) | Polishing uniformity (%) |
|---|---|---|---|
| 21 | 0.5 | 17 | Not significant |

In this example, it is determined that the use of a colloidal silica suspension with basic pH in association with 0.5 EP Emulsogen gives very low polishing speeds, which is poor within the scope of the present invention.

The invention claimed is:

1. A process for mechanical chemical polishing in the integrated circuits industry, comprising
    rubbing a layer with a support impregnated with an abrasive liquid composition, wherein
    said layer is (1) a material selected from the group consisting of silicon oxide, silicon nitride, and a polymer having a low dielectric constant, or (2) one layer of silicon oxide and another layer of silicon nitride, and
    said abrasive liquid composition comprises an aqueous acid suspension of
    (i) individualized colloidal silica particles not linked to each other by siloxane bonds,
    together with (ii) a surfactant, and
    wherein said abrasive liquid composition is at a pH of 1–5.

2. The process of claim 1, wherein said surfactant is an anionic or non-ionic surfactant.

3. The process of claim 2, wherein said surfactant is anionic.

4. The process of claim 3, wherein said rubbing is carried out with said individualized colloidal silica particles which have diameters between 12 nm and 100 nm.

5. The process of claim 4, wherein said pH is between 2 and 3, and
    said particle size is between 35 and 50 nm.

6. The process of claim 5, wherein the concentration by weight of said individualized colloidal silica particles is between 25 and 35% in said aqueous acid suspension.

7. The process of claim 6, wherein the volumetric concentration of said surfactant is between 0.01% and 1%.

8. The process of claim 5 wherein the volumetric concentration of said surfactant is between 0.001% and 5%.

9. The process of claim 4 wherein the volumetric concentration of said surfactant is between 0.001% and 5%.

10. The process of claim 2 wherein the volumetric concentration of said surfactant is between 0.001% and 5%.

11. The process of claim 2, wherein the volumetric concentration of said surfactant is between 0.01% and 1%.

12. The process of claim 2, wherein said rubbing is carried out with said individualized colloidal silica particles which have diameters between 12 nm and 100 nm.

13. The process of claim 12, wherein said pH is between 2 and 3, and
    said particle size is between 35 and 50 nm.

14. The process of claim 13, wherein the concentration by weight of said individualized colloidal silica particles is between 25 and 35% in said aqueous acid suspension.

15. The process of claim 12, wherein the concentration by weight of said individualized colloidal silica particles is between 25 and 35% in said aqueous acid suspension.

16. The process of claim 1, wherein said rubbing is carried out with said individualized colloidal silica particles which have diameters between 12 nm and 100 nm.

17. The process of claim 16, wherein said pH is between 2 and 3, and
    said particle size is between 35 and 50 nm.

18. The process of claim 17, wherein the concentration by weight of said individualized colloidal silica particles is between 25 and 35% in said aqueous acid suspension.

19. The process of claim 16, wherein the concentration by weight of said individualized colloidal silica particles is between 25 and 35% in said aqueous acid suspension.

20. The process of claim 16, wherein the volumetric concentration of said surfactant is between 0.01% and 1%.

21. A process for mechanical chemical polishing in the integrated circuits industry, comprising
    rubbing a layer with a support impregnated with an abrasive liquid composition, wherein said layer is (1) a material selected from the group consisting of silicon oxide, silicon nitride, and a polymer having a low dielectric constant, or (2) one layer of silicon oxide and another layer of silicon nitride, and said abrasive liquid composition consists essentially of an aqueous acid suspension of (i) individualized colloidal silica particles not linked to each other by siloxane bonds, together with (ii) a surfactant, and wherein said abrasive liquid composition is at a pH of 1–5.

22. The process of claim 21, wherein said surfactant is an anionic or non-ionic surfactant.

23. The process of claim 21, wherein the pH is between 2 and 3.

24. A process for mechanical chemical polishing in the integrated circuits industry, comprising rubbing a layer with a support impregnated with an abrasive liquid composition, wherein said layer comprises one layer of silicon oxide and another layer of silicon nitride, and said abrasive liquid composition is an aqueous acid suspension, having a pH of 1–5, of (i) individualized colloidal silica particles not linked to each other by siloxane bonds, together with (ii) a surfactant, wherein said abrasive liquid composition is substantially free of other components.

* * * * *

UNITED STATES PATENT AND TRADEMARK OFFICE
CERTIFICATE OF CORRECTION

PATENT NO.         : 7,144,814 B2                                       Page 1 of 1
APPLICATION NO. : 09/427675
DATED              : December 5, 2006
INVENTOR(S)        : Jacquinot et al.

It is certified that error appears in the above-identified patent and that said Letters Patent is hereby corrected as shown below:

On the Title page, item 57, in the Abstract, the phrase "an abrasive surfactant" should read --a surfactant--.

Signed and Sealed this

Tenth Day of April, 2007

JON W. DUDAS
*Director of the United States Patent and Trademark Office*